(12) United States Patent
Cohen

(10) Patent No.: US 7,573,133 B2
(45) Date of Patent: Aug. 11, 2009

(54) INTERCONNECT STRUCTURES AND METHODS FOR THEIR FABRICATION

(76) Inventor: Uri Cohen, 4147 Dake Ave., Palo Alto, CA (US) 94306

( * ) Notice: Subject to any disclaimer, the term of this patent is extended or adjusted under 35 U.S.C. 154(b) by 615 days.

(21) Appl. No.: 10/858,191

(22) Filed: Jun. 1, 2004

(65) Prior Publication Data

US 2005/0127479 A1 Jun. 16, 2005

Related U.S. Application Data

(60) Provisional application No. 60/528,561, filed on Dec. 9, 2003.

(51) Int. Cl.
*H01L 23/52* (2006.01)
(52) U.S. Cl. .................... 257/758; 257/769
(58) Field of Classification Search .......... 257/758, 257/762, 769; 438/118, 622, 687
See application file for complete search history.

(56) References Cited

U.S. PATENT DOCUMENTS

| | | | | |
|---|---|---|---|---|
| 4,330,347 | A | 5/1982 | Hirayama et al. | 148/31.5 |
| 4,612,410 | A | 9/1986 | Hewig et al. | 136/256 |
| 4,755,394 | A | 7/1988 | Aoki et al. | 427/123 |
| 5,281,304 | A | 1/1994 | Kadomura | 156/656 |
| 5,451,542 | A | 9/1995 | Ashby | 437/173 |
| 5,863,834 | A * | 1/1999 | Kawaguchi et al. | 438/625 |
| 5,913,147 | A | 6/1999 | Dubin et al. | 438/687 |
| 5,953,628 | A * | 9/1999 | Kawaguchi | 438/635 |
| 6,181,012 | B1 | 1/2001 | Edelstein et al. | 257/762 |
| 6,181,013 | B1 * | 1/2001 | Liu et al. | 257/762 |
| 6,228,759 | B1 | 5/2001 | Wang et al. | 438/625 |
| 6,429,117 | B1 | 8/2002 | Sudijono et al. | 438/627 |
| 6,683,002 | B1 * | 1/2004 | Chooi et al. | 438/687 |
| 6,689,689 | B1 | 2/2004 | Besser et al. | 438/687 |
| 6,713,373 | B1 | 3/2004 | Omstead et al. | 438/608 |
| 6,798,068 | B2 | 9/2004 | Oglesby | 257/759 |
| 6,836,017 | B2 * | 12/2004 | Ngo et al. | 257/751 |
| 6,841,473 | B1 * | 1/2005 | Wang et al. | 438/661 |
| 6,858,527 | B2 | 2/2005 | Gracias | 438/628 |
| 6,873,057 | B2 | 3/2005 | Chen et al. | 257/777 |
| 6,893,895 | B1 | 5/2005 | Okoroanyanwu et al. | 438/99 |
| 6,939,800 | B1 * | 9/2005 | Lu et al. | 438/643 |
| 2002/0027261 | A1 | 3/2002 | Besser et al. | 257/584 |
| 2003/0116439 | A1 | 6/2003 | Seo et al. | 205/125 |
| 2003/0135061 | A1 | 7/2003 | Norman et al. | 556/9 |
| 2004/0051117 | A1 | 3/2004 | Chyan et al. | 257/200 |
| 2004/0121583 | A1 * | 6/2004 | Bao et al. | 438/627 |

(Continued)

FOREIGN PATENT DOCUMENTS

JP 2000077412 A * 3/2000

OTHER PUBLICATIONS

Reference (B1-B6) Sophie Cassaignon et al., "Influence of the Composition on the Copper Diffusion in Copper Sulfides," Jul. 1999, Journal of The Electrochemical Society, 146 (12), pp. 4666-4671.*

(Continued)

*Primary Examiner*—Matthew E Warren (57) ABSTRACT

One or more embodiments of the present invention relate to structures obtained by methods (a) for growing a film by an intermixing growth process, or (b) by depositing a film, which film includes chalcogenides of copper and/or silver (but excluding oxides), such as, for example, copper sulfide ($CuS_X$ and/or $Cu_2S_X$, where $0.7 \leq X \leq 1.3$; and $X=1.0$ for stoichiometric compounds).

20 Claims, 2 Drawing Sheets

U.S. PATENT DOCUMENTS

| | | | |
|---|---|---|---|
| 2004/0227247 A1* | 11/2004 | Chooi et al. | 257/758 |
| 2004/0238961 A1 | 12/2004 | Cunningham | 257/758 |
| 2004/0251549 A1* | 12/2004 | Huang et al. | 257/758 |
| 2005/0093162 A1 | 5/2005 | Gracias | 257/759 |

OTHER PUBLICATIONS

Reference (B7-B15) Leslie H. Allen et al., "Copper electrodmigration in polycrystalline copper sulfide," Jul. 1984, Journal of Applied Physics, 56 (12), pp. 327-335.*

Reference (B16-21) Leslie H. Allen et al., "Effect of ionic electromigration on CU(2-a) S/CdS solar cell" Feb. 1986 Journal of Applied Physics, 59 (4), pp. 1360-1365.*

E. J. King, "Qualitative Analysis and Electrolytic Solutions", Harcourt, Brace & World, Inc., 1959, pp. 140-143; 156-157; 178-185; 392-397.

Metals Handbook, vol. 8, 8$^{th}$ Edition (1973), American Society for Metals, pp. 297; 300; 358.

S. K. Ghandhi, "VLSI Fabrication Principles", John Wiley & Sons, 1983, pp. 377-383.

H. Itow et al., "Self-aligned passivation on copper interconnection durability against oxidizing ambient annealing", Appl. Phys. Letters 63 (7), Aug. 16, 1993, pp. 934-936.

R.V.A. Rowe et al., "Low-resistance films of polyimides with impregnated copper sulfide", J. Mater. Res. vol. 16, No. 11, Nov. 2001, pp. 3097-3106.

J. Johansson et al., "Growth of conductive copper sulfide thin films by atomic layer deposition", J. Mater. Chem., 2002, vol. 12, pp. 1022-1026.

I. Ancutiene, "Modification of Polyethylene of Various Density by Layers of Copper Sulfide", ISSN 1392-1320 Materials Science (MEDZIAGOTYRA), vol. 9, No. 4, 2003, pp. 351-354.

S. Arai et al., "Effect of S on Passivation of Ni Plating", J. Electrochem. Soc., 151 (1), 2004, pp. C15-C18.

B. Lee, "Electroless CoWP Boosts Copper Reliability, Device Performance", Semiconductor International, Jul. 2004, pp. 95-100.

J. Cardoso et al., "Conductive copper sulfide thin films on polyimide foils", 2001 Semicond. Sci. Technol., vol. 16 (2001), pp. 123-127.

T. Sakamoto et al., "Nanometer-scale switches using copper sulfide", Appl. Phys. Letters vol. 82 (18), May 5, 2003, pp. 3032-3034.

I. Grozdanov, "A simple and low-cost technique for electroless deposition of chalcogenide thin films", Semicond. Sci. Technol. vol. 9 (1994), pp. 1234-1241.

A. Neisser et al., "Cu(In,Ga)S$_2$ Phase Formation from Metallic Cu-In-Ga Precursor Stacks in Rapid Thermal Processes", Mat. Res. Soc. Symp. Proc. vol. 668 (2001), pp. H1.3.1-H1.3.6.

I. V. Luck et al., "Growth Monitoring of Cu-Poor Prepared CuInS$_2$ Thin Films", Mat. Res. Soc. Symp. Proc. vol. 668 (2001), pp. H1.4.1-H1.4.6.

J. Titus et al., "Post-Deposition Sulfur Incorporation into CuInSe$_2$ Thin Films", Mat. Res. Soc. Symp. Proc. vol. 668 (2001), pp. H1.5.1-H1.5.6.

T. Wada et al., "Physical Vapor Deposition of Cu(In,Ga)Se$_2$ Films for Industrial Applications", Mat. Res. Soc. Symp. Proc. vol. 668 (2001), pp. H2.1.1-H2.1.12.

N. G. Dhere et al., "CIGS2 Thin Film Solar Cells On Stainless Steel Foil", Mat. Res. Soc. Symp. Proc. vol. 668 (2001), pp. H3.4.1-H3.4.6.

I. Konovalov et al., "Electronic Properties of Cu-In-S Solar Cells on Cu-Tape Substrate", Mat. Res. Soc. Symp. Proc. vol. 668 (2001), pp. H5.15.1-H5.15.6.

F. Donsanti et al, "Atomic Layer Deposition of Indium Sulfide Layers for Copper Indium Gallium Diselenide Solar Cells", Mat. Res. Soc. Symp. Proc. vol. 668 (2001), pp. H8.20.1-H8.20.8.

D. Guimard et al., "Efficient Cu(In,Ga)Se2 Based Solar Cells Prepared By Electrodeposition", Mat. Res. Soc. Symp. Proc. vol. 763 (2003), pp. B6.9.1-B6.9.6.

N. Naghavi et al., "Towards Better Understanding of High Efficiency Cd-free CIGS Solar Cells Using Atomic Layer deposition Indium Sulfide Buffer Layers", Mat. Res. Soc. Symp. Proc. vol. 763 (2003), pp. B9.9.1-B9.9.6.

G. A. Armantrout et al., "Photovoltaic Properties of Reactively Sputtered Cu$_x$S Films and Reactively Sputtered Cu$_x$S-CdS Heterojunctions", 13$^{th}$ IEEE Photovoltaic Specialists Conference, 1978, pp. 383-392.

J. J. Loferski et al., "Cathodoluminescence Characteristics of Cu$_x$S Films Produced by Different Methods", Solar Energy Materials, vol. 1 (1979), pp. 157-169.

L. Hmurick, L. Allen, and R. Serway, "The effects of heat treatments on the transport properties of Cu$_x$S thin films", J. Applied Physics, vol. 53(12), Dec. 1982, pp. 9063-9072.

L. H. Allen and E. Bunks, "Copper electromigration in polycrystalline copper sulfide", J. Applied Physics, vol. 56(2), Jul. 1984, pp. 327-335.

L. H. Allen and E. Bunks, "Effect of ionic electromigration on Cu$_{2-a}$S/CdS solar cell", J. Applied Physics, vol. 59(4), Feb. 1986, pp. 1360-1365.

S. Cassaignon et al., "Influence of the Composition on the Copper Diffusion in Copper Sulfides", J. of the Electrochemical Society, vol. 146(12), Dec. 1999, pp. 4666-4671.

W. Kai, G. W. Fan, P.C. Chen, and Y.T. Lin, "The Corrosion of Cu-Al Binary Alloys in H2/H2S/H2O Atmosheres at 400-900° C.", Oxidation of Metals, vol. 61, Nos. 5/6, Jun. 2004, pp. 439-461.

* cited by examiner

INTERCONNECT STRUCTURES AND METHODS FOR THEIR FABRICATION

This application claims the benefit of U.S. Provisional Application No. 60/528,561, filed on Dec. 9, 2003, which application is incorporated herein by reference.

TECHNICAL FIELD OF THE INVENTION

One or more embodiments of the present invention relates to the field of Very Large Scale Integration (VLSI) and Ultra Large Scale Integration (ULSI) semiconductor devices, Thin Film Head (TFH) devices, Micro Electronic Machined Systems (MEMS), and high density electronic device packaging such as, for example and without limitation, Flip Chip, Chip Scale Packaging (CSP), Wafer Scale Packaging (WSP), and 3-D packaging.

BACKGROUND OF THE INVENTION

In fabricating Damascene and Dual Damascene (DD) copper interconnects in accordance with prior art techniques, copper is encased in one or more copper diffusion barrier layers. Typically, Ta/TaN$_X$ is used as a barrier layer for sidewalls and at the bottom of long lines, and a relatively high-k dielectric layer, typically silicon nitride (or silicon carbide, or silicon oxide carbon nitride), is used as a top capping barrier layer. The use of a relatively high-k dielectric (such as silicon nitride) capping barrier layer is problematic, among other reasons, because: (a) such a high-k dielectric has poor adhesion to a copper surface, thereby impairing structural strength and integrity; and (b) it does not block interfacial copper diffusion at the interface between the copper and the silicon nitride.

As is well known, electromigration (EM) in copper interconnects is problematic because EM reduces reliability and leads to device failure. Because the copper surface diffusion activation energy (i.e., only about 0.7-0.9 eV) is lower than the copper bulk diffusion activation energy (i.e., about 1.2 eV), unbound interfacial copper atoms diffuse faster at the interface between copper and a silicon nitride capping layer than in the bulk copper. As a result, interfacial diffusion is largely responsible for electromigration (EM) in copper interconnects. Silicon nitride does not prevent or inhibit interfacial diffusion because silicon nitride has poor adhesion to copper, and does not effectively passivate (or immobilize) the top copper surface atoms. There have been attempts in the prior art to reduce interfacial diffusion by replacing silicon nitride. For example, to reduce surface diffuision at the top copper surface, in accordance with one prior art method, a top capping silicon nitride is replaced with, or preceded by, a selective, self-aligned, electroless deposited, metallic layer such as Pd, CoP$_X$, CoW$_X$P$_Y$, CoW$_X$B$_Y$, or CoSn$_X$P$_Y$. Such an electroless deposition process is problematic, among other reasons, because: (a) electroless deposition has (i) an erratic incubation (or initiation) period during which there is no deposition, and (ii) an erratic deposition rate due to inherent bath instability and aging; (b) non-selective spontaneous deposition on surrounding dielectrics which may result in bridging and/or increasing leakage current between conductor lines; (c) spontaneous deposition due to bath instability (i) on chamber walls, and (ii) in-situ in the bath; (d) contamination of exposed dielectric; and (e) deposited metal or alloy may have poor adhesion to a successively deposited dielectric layer, thereby impairing the structural strength and integrity of the device.

In light of the above, there is a need for methods and films that solve one or more of the above-identified problems.

SUMMARY OF THE INVENTION

One or more embodiments of the present invention solve one or more of the above-identified problems. In particular, one or more embodiments of the present invention relate to methods (a) for growing a film by an intermixing growth process or (b) by depositing a film, which film comprises chalcogenides of copper and/or silver (but excluding oxides), such as, for example, copper sulfide (CuS$_X$ and/or Cu$_2$S$_X$, where $0.7 \leq X \leq 1.3$; and X=1.0 for stoichiometric compounds).

DETAILED DESCRIPTION

Figure 1A:
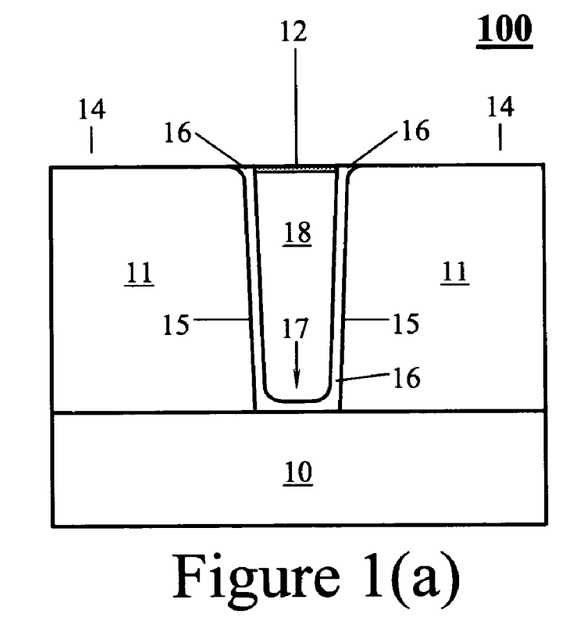
FIG. 1(a) shows a pictorial representation of a transverse (along the width) cross-section of a structure used to fabricate, for example and without limitation, a semiconductor device that includes a conductor structure fabricated in accordance with one or more embodiments of the present invention.

FIG. 1(a) shows a pictorial representation of a transverse (along the width) cross-section (not to scale for ease of understanding) of structure 100 used to fabricate, for example and without limitation, a semiconductor device that includes a conductor structure comprised of conductive interconnect 18. Conductive interconnect 18 may comprise a metal or metal alloy such as, for example and without limitation, Cu, Ag, or alloys comprising one or more of these metals. Structure 100 may be fabricated as follows. In accordance with any one of a number of methods that are well known to those of ordinary skill in the art, dielectric layer 11 may be deposited over substrate 10, which substrate 10 may comprise one or more layers such as, for example and without limitation, a lower metallization level and/or another dielectric layer. Next, in accordance with any one of a number of methods that are well known to those of ordinary skill in the art, an opening having sidewall surfaces 15 and bottom surface 17 may be pattern-etched in dielectric layer 11, and barrier layer 16 and one or more seed layers (not shown in FIG. 1) may be deposited over sidewalls 15 and bottom surface 17 of the opening. Barrier 16 may comprise, for example and without limitation, a refractory metal or an alloy comprising a refractory metal, such as Ta, TaN$_X$, Ta/TaN$_X$, Ru, TaSi$_X$N$_Y$, WN$_X$, Ti/TiN$_X$, TiSi$_X$N$_Y$, or WSi$_X$N$_Y$. One or more seed layers (not shown) are then deposited over the metallic barrier 16. Next, in accordance with any one of a number of methods that are well known to those of ordinary skill in the art, for example and without limitation, using electrofilling methods, the opening may be filled with conductive interconnect 18. Next, in accordance with any one of a number of methods that are well known to those of ordinary skill in the art, for example and without limitation, using one or more planarization and/or removal techniques, such as chemical mechanical polishing (CMP), polishing, electro-dissolution, electropolishing, or chemical etching, excess conductor in conductor 18 and excess conductor over dielectric 11 in field 14, as well as any seed and barrier layers overlying field 14, may be removed to expose a top surface of conductor interconnect metal 18 and a top surface of field 14. This step is sometimes referred to in the art as a removal or planarization step.

In accordance with one or more embodiments of the present invention, following the removal or planarization step, the exposed top surface of conductor interconnect 18 is covered with passivation film 12. In accordance with one or more embodiments of the present invention, the step of covering the exposed top surface of conductor interconnect 18 with passivation film 12 comprises providing passivation film 12 over the exposed top surface of conductive metal 18 by, for example and without limitation, an intermixing growth process or a deposition process. The term "intermixing growth" process is defined herein as a process in which a film grows on a surface of a material, which film comprises one or more constituents of the material and one or more constituents of a reactant. One example, without limitation, of an intermixing growth process involves diffusion across a growing film of one or more constituents from the material to the surface of the growing film, and/or diffusion across the growing film of one or more constituents from the reactant to the interface between the material and the growing film. For example and without limitation, silicon dioxide growth by oxidation of a silicon surface (such as described in a book entitled "VLSI Fabrication Principles" by S. K. Ghandhi, pp. 377-383, John Wiley & Sons, Inc. (1983)) is an intermixing growth process. The term "deposition" is defined herein as any process in which all of the constituents of a film originate from reagents external to the surface of a material. Some examples, without limitation, of deposition processes are electrodeposition, electroless deposition, chemical bath deposition (CBD), physical vapor deposition (PVD), chemical vapor deposition (CVD), and atomic layer deposition (ALD).

Intermixing Growth

In accordance with one or more embodiments of the present invention, passivation film 12 may be fabricated by reacting the exposed top surface of conductor interconnect 18 with one or more reactants to fabricate one or more materials that adhere strongly to the exposed conductor 18 surface. In accordance with one or more such embodiments, it is believed that strong adhesion is provided because at least one of such materials is chemically bonded to material at the exposed top surface of conductor interconnect 18. Advantageously, in accordance with one or more of such embodiments, it is believed that passivation film 12 grows selectively, i.e., it grows only on exposed surface of conductor interconnect 18, and not on dielectric 11 at the exposed surface of field 14. In such a case, film 12 is also self-aligned to the top surface of conductor 18.

In accordance with one or more embodiments of the present invention, conductor interconnect 18 comprises copper, and passivation film 12 comprises a copper sulfide such as $CuS_X$ and/or $Cu_2S_X$ (where $0.7 \leq X \leq 1.3$; and $X=1.0$ for stoichiometric compounds), and/or other materials comprising one or more of these compounds. Copper sulfide film 12 can be grown by an intermixing growth process, for example and without limitation, by sulfidation of (or reacting) the exposed top surface of copper interconnect 18 with a sulfur-bearing reactant gas (or gas mixture) comprising sulfur atoms, molecules, or ions such as, for example and without limitation, $H_2S$ or vapors of elemental sulfur ($S_n$; where n is an integer). It is believed that in accordance with such embodiments, copper sulfide film 12 is grown by an intermixing growth process according to the following chemical reactions:

The rate of growth of film 12 can be increased or decreased by raising or lowering, respectively, the temperature of structure 100 and/or the reactant gas. The growth rate can also be increased or decreased by increasing or decreasing, respectively, the concentration (or partial pressure) of the reactant gas.

For example and without limitation, copper sulfide film 12, having a thickness of about 10 Å to about 2,000 Å, can be grown by an intermixing sulfidation process on the top surface of copper conductor 18 by subjecting a wafer with exposed conductor 18 to an $H_2S$ gas (or a gas mixture of $H_2S$ with inert gas, such as argon or nitrogen), or to a sublimed sulfur vapor, at a temperature from about 25° C. to about 500° C. The dry sulfidation can be performed in a furnace, such as a rapid thermal processing (RTP) furnace, at sulfidation times ranging from a few seconds to about 10 minutes. The higher the substrate temperature and/or the longer the exposure time, the thicker the copper sulfide film 12, and vice versa.

Copper sulfide film 12 may also be grown by an intermixing growth process in accordance with one or more further embodiments of the present invention by reacting the exposed top surface of copper interconnect 18 with a wet solution which contains one or more sulfur-bearing compounds comprising sulfur atoms, molecules, or ions, such as, for example and without limitation, solutions comprising elemental sulfur ($S_n$) or sulfide ions ($S^{-2}$) of $Na_2S$, $K_2S$, $(NH_4)_2S$, and dissolved $H_2S$. It is believed that in accordance with such embodiments, copper sulfide film 12 is grown by an intermixing growth process according to the following chemical reactions:

In accordance with one or more of such embodiments, dipping or spraying the top surface of copper interconnect 18 in the wet solution is continued until a predetermined thickness of film 12 is approached or attained (as will be described below, it is believed that the predetermined thickness may be a self-limited thickness). The rate of growth of film 12 can be increased or decreased by raising or lowering, respectively, the temperature of the wet solution and/or structure 100. The growth rate of film 12 can also be increased or decreased by increasing or decreasing, respectively, the concentration of the sulfur-bearing reactant in the solution.

It may be advantageous to grow film 12 by an intermixing self-limiting growth process, to its self-limited thickness at a temperature higher (for example and without limitation, by at least 50° C., and more specifically, by at least 100° C.) than the operational temperatures attained during device operation. It is believed that this will help prevent copper diffusion across film 12 during operation of the device, or it might even substantially prevent such copper diffusion. In such a case, passivation film 12 can also function (and be used) as a diffusion barrier layer, in addition to its passivation role (by immobilizing top surface atoms of conductor 18). However, as is well-known, the actual growth temperature might be limited by a thermal budget, or by other processing and/or integration considerations, and a trade-off might be required. In light of this information, appropriate values of temperature can be determined for a particular application by one of ordinary skill in the art routinely and without undue experimentation. "Self-limited thickness" is defined herein as the thickness attained after a certain growth time, $\Delta t$ (at a specific growth temperature), which increases by less than about 25% when the growth time is extended by another $\Delta t$, or more. For example, if the thickness of film 12 is about 200 Å after 5 minutes growth at a given temperature, and it is less than about 250 Å after additional 5 minutes growth at the same temperature, then the self-limited thickness of film 12 is about 200 Å. The self-limited thickness is a strong function of the growth temperature, increasing with the growth temperature. It is believed that the thickness of passivation film 12 has to be larger than about 300 Å and, probably larger than about 500 Å, for it to function as an efficient diffusion barrier. Using film 12 alone as a diffusion barrier (see FIG. 1(a)), without dielectric barrier layer 19, would have the distinct advantages of significantly reducing the effective dielectric constant ($k_{eff}$) of the multilevel interconnect, while improving its reliability, structural strength, and integrity.

In General, the $Cu_2S_X$ phases are thermally more stable than the $CuS_X$ phases. For example, the $Cu_2S_X$ δ-phase has a maximum melting point of 1,131° C., whereas the $CuS_X$ ∈-phase is not stable above 507° C., and undergoes phase transformations at 76° C. and at 115° C. See Metals Handbook, 8$^{th}$ Edition, Vol. 8, pages 297, 300, 358, American Society for Metals, 1973. A reference herein to a $Cu_2S_X$ phase may also include the case of more than a single phase and, similarly, a reference herein to a single $CuS_X$ phase may also include the case of more than a single phase. It is believed that when film 12 comprises the $Cu_2S_X$ phase, it is more stable and, therefore, may be more desirable. As a result, if film 12 is formed (by intermixing growth) by reacting a sulfur-bearing reactant gas or vapor on copper conductor 18, at temperatures above about 500° C., only the $Cu_2S_X$ phase is formed. Similarly, if film 12 is first formed as the phase $CuS_X$ (alone or in a multiple phase structure) and, if the film is subsequently heated (or annealed) to above about 500° C., then film 12 will convert to the $Cu_2S_X$ phase.

However, depending on the thickness of film 12 and subsequent heating (or annealing), film 12 may convert entirely into the $Cu_2S_X$ phase at even lower temperatures than about 500° C. For example, it is believed that a relatively thin (about 30 Å to about 200 Å) copper sulfide(s) film 12 will convert entirely into the $Cu_2S_X$ phase by annealing it for a relatively short time (about 0.5 minute to about 10 minutes) at a temperature between about 100° C. to about 400° C. and, more specifically, between about 150° C. to about 300° C. It is believed that film 12 converts to the $Cu_2S_X$ phase by reacting with excess copper on the conductor 18 side, while there is no fresh supply of sulfur species on the other side of film 12. Thicker film 12 may require longer annealing time and/or higher annealing temperature to fully convert into the $Cu_2S_X$ phase. Subsequent annealing of film 12 can be performed as a separate dedicated processing step, or during another elevated temperature processing step such as, for example and without limitation, during deposition of dielectric barrier 19 in FIG. 1(b), for example, by a CVD process. For example, it is believed that when the thickness of film 12 is in a range of about 30 Å to about 200 Å, the processing temperature during a subsequent CVD or plasma enhanced CVD (PECVD) deposition step (for example and without limitation, of a silicon nitride or a silicon carbide barrier layer 19) is sufficiently high and is present for a long enough time to fully convert any other phase(s) of film 12 into the $Cu_2S_X$ phase.

In accordance with one or more still further embodiments of the present invention, film 12 grown by an intermixing growth process on copper interconnect 18 comprises one or more of $CuSe_X$, $Cu_2Se_X$, $CuTe_X$, $Cu_2Te_X$ (where $0.7 \leq X \leq 1.3$; and X=1.0 for stoichiometric compounds)—where copper selenide refers to $CuSe_X$ and/or $Cu_2Se_X$ and copper telluride refers to $CuTe_X$ and/or $Cu_2Te_X$. In still further embodiments, film 12 comprises one or more of $CuS_X$, $Cu_2S_X$, $CuSe_X$, $Cu_2Se_X$, $CuTe_X$, $Cu_2Te_X$ (where $0.7 \leq X \leq 1.3$; and X=1.0 for stoichiometric compounds), and other materials comprising one or more of these compounds.

Copper selenide can be grown by an intermixing growth process by reacting the exposed top surface of copper interconnect 18 with a wet reactant, or a dry reactant gas (or gas mixture) or vapor of one or more selenium-bearing compounds comprising selenium atoms, molecules, or ions. Copper telluride can be grown by an intermixing growth process by reacting the exposed top surface of copper interconnect 18 with a wet reactant, or a dry reactant gas (or gas mixture) or vapor of one or more tellurium-bearing compounds comprising tellurium atoms, molecules, or ions. For example, in order to grow copper selenide by an intermixing growth process on the copper surface, the copper surface may be reacted with (for example and without limitation) $H_2Se$, $Na_2Se$, $K_2Se$, or $(NH_4)_2Se$. Similarly, in order to grow copper telluride by an intermixing growth process on the copper surface, the copper surface may be reacted with (for example and without limitation) $H_2Te$, $Na_2Te$, $K_2Te$, or $(NH_4)_2Te$.

It is believed that one or more of the above-described embodiments for growing film 12 by an intermixing growth process is a self-limiting process. In particular, it is believed that the process is self-limiting by copper and/or sulfur (or sellenium or tellurium) diffusion through (or across) the film as it grows. In particular, it is believed that as the thickness of the growing film increases, the flux of copper species that travel from copper interconnect 18 through film 12 and/or the flux of sulfur (or sellenium or tellurium) species that travel from the surface through film 12 slows down until it or they become substantially negligible or insignificant. In particular, it is believed that a self-limited thickness of film 12 depends on temperature, the density of the film, and its morphology. For example, if the growth temperature is higher, the final thickness will be greater (assuming sufficient growth time of the film to its self-limited thickness), and the film will form faster. However, it is also believed that, if the density of the film is so low that there are high rates of diffusion, or if the film contains voids and/or many defects, the process may not be self-limiting. It is further believed that the process is confined to a self-limiting process by enabling diffusion to take place fast enough (during film formation) to growth sites to avoid forming voids. This may be done by raising the growth temperature and/or by providing lower concentration or amount of the reactant to the surface to ensure that the diffusing species can reach their proper growth sites without forming voids. In light of this information, appropriate values of temperature and reactant concentration or amounts can be determined for a particular application by one of ordinary skill in the art routinely and without undue experimentation.

It should be understood that in some semiconductor processes, the use of compounds containing alkali metal ions might be problematic due to the possibility of contamination. In such cases, for example and without limitation, ammonium sulfide or dissolved $H_2S$ may be used to avoid such alkali metal contamination. Other chemical reagents which comprise sulfur such as, for example and without limitation, elemental sulfur (S), $SO_2$, sulfites, thioacetamide, thiourea, or thiosulfates may also be used to form film 12. As such, one or more embodiments of the present invention include the use of any chemical reagent suitable for reaction with the exposed top surface of conductor 18 to form passivation film 12 comprising a copper sulfide.

Advantageously, film 12 formed as described above is grown on top of conductor interconnect 18, and does not grow on top 14 of the surrounding dielectric layer 11. As such, growth of passivation film 12 by an intermixing growth process provides a selective process which advantageously helps avoid current leakage through dielectric layer 14. It is further believed that the passivating reactant can advantageously passivate any exposed copper residue (contamination) left on (or embedded onto) field 14 of surrounding dielectric 11 following the CMP step. This is advantageous because it may further reduce leakage currents between interconnect lines. In addition, and advantageously in accordance with one or more embodiments of the present invention related to copper interconnect, it is believed that passivation film 12 is chemically bonded to the copper conductor 18 underneath it, thereby adhering well to the top surface of copper conductor interconnect 18. As such, it is believed that film 12 can reduce or eliminate copper interfacial surface diffusion and, thereby, reduce or eliminate electromigration (EM).

Figure 1B:
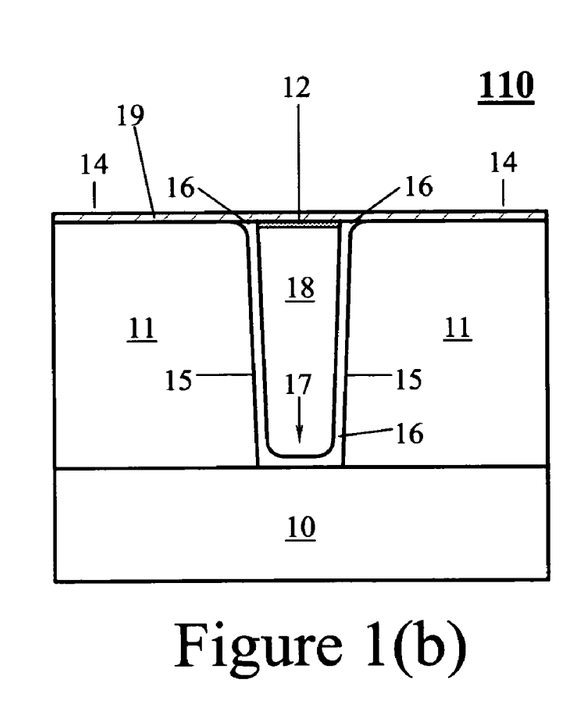
FIG. 1(b) shows a pictorial representation of a transverse (along the width) cross-section of a structure used to fabricate, for example and without limitation, a semiconductor device that includes a conductor structure fabricated in accordance with one or more further embodiments of the present invention.

Copper sulfide passivation film 12 described above is further advantageous because it also adheres well to dielectric layers such as, for example and without limitation, dielectric layers that overlay in structures used to fabricate devices such as semiconductor devices, thereby improving the mechanical strength and the structural integrity of multi-level metallization devices. Furthermore, since copper sulfide film 12 is not a dielectric material (actually it is conductive, having a resistivity p value in a range of about $10^{-4}$ to about $10^{-2}$ ohm-cm), it does not increase the effective dielectric constant ($k_{eff}$) of structures 100 or 110. In accordance with one or more embodiments, the thickness of passivation film (or layer) 12 may be in a range from about 10 Å to about 500 Å and, more specifically, in a range from about 50 Å to about 200 Å.

EXAMPLE 1

A sulfidation bath solution of 0.01N sodium thiosulfate ($Na_2S_2O_3$) was prepared by mixing 1 volume of 0.1N solution of $Na_2S_2O_3$ in 9 volumes of deionized (DI) water. The solution was acidified to a pH of about 1.5 by adding dilute (1:10 v/v) solution of $H_2SO_4$. The solution became colloidal ("milky"), indicating the release of elemental sulfur. It is believed that the sulfur was released by the chemical reaction:

$nS_2O_3^{-2} + nH^+ \Rightarrow S_n + nHSO_3$ (where n is an integer)

A copper strip was cleaned in acetone, rinsed in DI, and dipped for 10 seconds in a dilute (1:10 v/v) solution of $H_2SO_4$ to remove any copper surface oxides, and rinsed in DI water. The copper strip was then dipped into the colloidal sulfur solution at a bath temperature of about 26° C., for about 1 minute. The immersed area of the copper strip became darker (pink to reddish) color, indicating a reaction with the colloidal sulfur solution. The copper strip was then dipped for additional 4 minutes (for a total dipping time of about 5 minutes), and the copper strip was then rinsed and dried. The immersed portion of the copper strip had deep purple to violet color. The color was gray-blue close to the strip edges. It is believed that the colloidal sulfur reacted with the immersed surface of the copper strip, by an intermixing growth process, according to one of the reactions described above (regarding film 12 of FIG. 1(a)) to form copper sulfide(s) film.

An adhesion tape-pull test was performed on the immersed portion of the copper strip. An adhesive 3M ("Scotch") tape was attached to the entire front surface (immersed plus unimmersed portions) of the strip, and the tape was pulled without any visible trace or residue on the tape. This test indicates good (or excellent) adhesion between the thus formed copper sulfide(s) film and the copper surface.

EXAMPLE 2

The experiment of Example 1 was repeated, using the same colloidal sulfur solution, but the sulfidation bath temperature was about 35° C., and the pH was about 1.32. After a dipping time of about 5 minutes, the immersed copper strip area developed a dark purple color, gradually changing to blue near the strip edges. The sample passed an adhesion tape-pull test without any visible trace or residue on the tape, again indicating good adhesion of the copper sulfide(s) to the copper surface.

To test etchability of the sulfide(s) film, a drop of (1:10 v/v) solution of $H_2SO_4$ was placed on the grown sulfide(s) film. After about 30 seconds there was no visible attack on the film. The same test was repeated with a drop of 36% $HNO_3$. After about 20 seconds visible gas bubbles formed under and around the drop. After additional 10 seconds etching in the nitric acid, the spot size increased and the color changed to pink, indicating etching into the underlying copper strip.

EXAMPLE 3

A fresh sulfidation colloidal sulfur solution was prepared, as described in Example 1. Copper samples were cut (or cleaved) from a silicon wafer with blanket Cu/Ta/TaN$_x$/SiO$_2$/Si, with a copper thickness of about 1,200 Å, deposited by PVD. Prior to sulfidation, the samples were activated by dipping in (1:10 v/v) solution of $H_2SO_4$ for about 30 seconds, followed by rinsing in DI. The sulfidation bath temperature was in the range of 39.0-40.5° C., and the pH was in the range of 1.62-1.64. Dipping times of the copper samples varied from about 0.5 minute to about 8.0 minutes.

Figure 2:
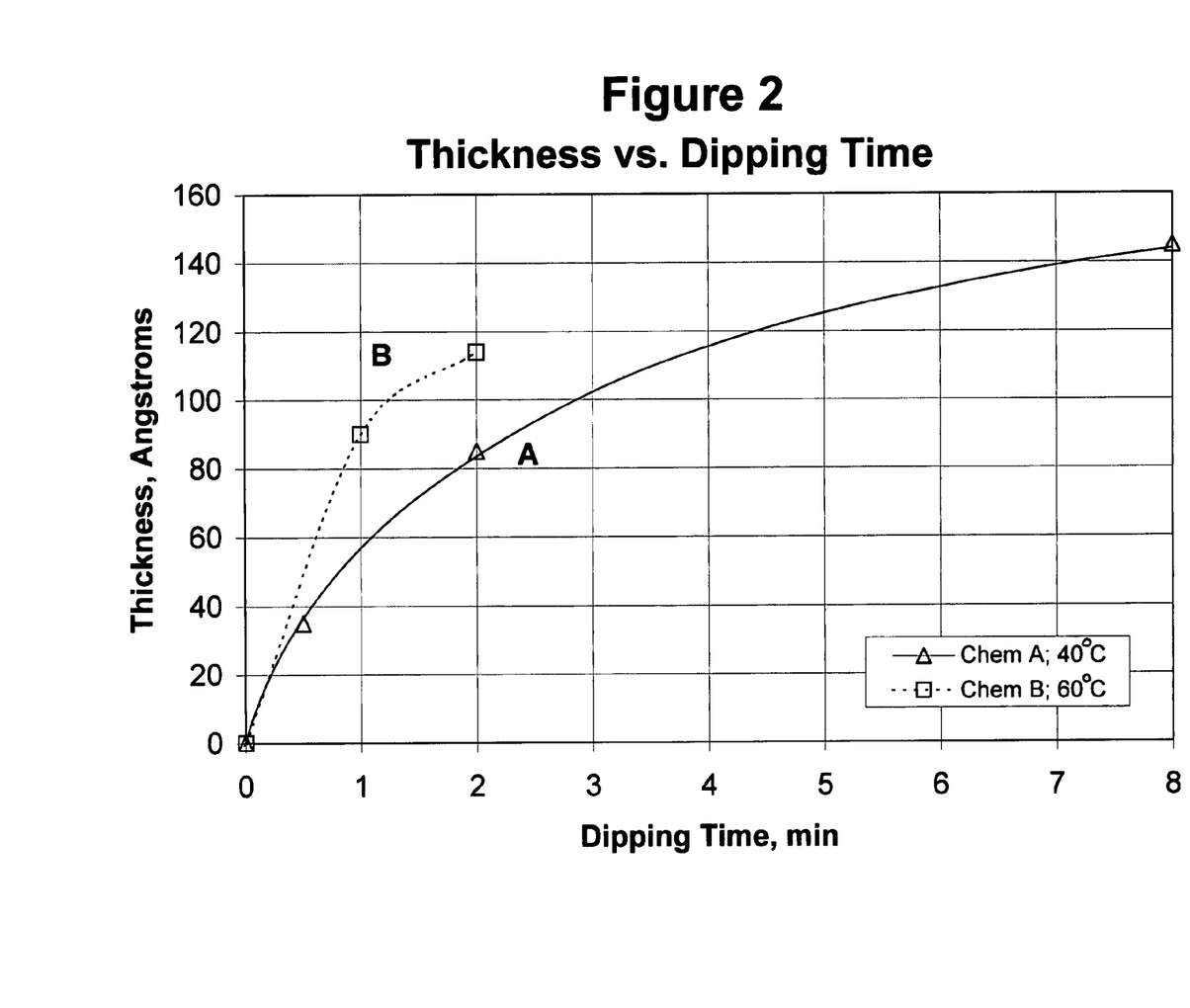
FIG. 2 shows data plots for Examples discussed in the Detailed Description.

Following sulfidation, several samples were analyzed by Auger Electron Spectroscopy (AES) for thickness (AES depth profile) and for composition. They were also inspected by Scanning Electron Microscope (SEM) for their surface structure and morphology. The analyzed sulfidation thickness is plotted as a function of the dipping time (in the acidic colloidal sulfur solution), at a nominal temperature of 40° C., as Graph A in FIG. 2. Graph A indicates a self-limiting growth process, in which the growth rate slows-down with increasing thickness. The sulfide(s) film obtained by dipping 4.0 minutes is close to be a self-limited thickness, since the thickness of ~145 Å, obtained after 8.0 minutes dip, is about 26% larger than the thickness of ~115 Å, obtained after 4.0 minutes dip (half the time). It is believed that, under the experimental conditions of Graph A, the copper sulfide(s) film self-limited thickness is about 120 Å to about 130 Å.

SEM inspection of the obtained sulfide film surfaces revealed pitting and surface roughening, which increased with the sulfidation (dipping) time in the acidic colloidal sulfur solution. It is believed that the pitting may have been caused by the (1:10 v/v) $H_2SO_4$ activation step, which may selectively attack defects in the PVD copper seed layer. In addition, occasional particles, believed to be elemental sulfur, were observed on the surfaces.

A potential problem with the acidic colloidal sulfur solution is that the colloidal solution is not stable, undergoing flocculation and/or agglomeration. This problem increases with bath age and temperature. Deposition of sulfur precipitate on the very fine interconnect structure may cause severe problems. However, the use of the (slightly) acidic environment is favorable, since it ensures a clean copper surface without interfacial copper oxides and/or hydroxides. It is believed that use of a freshly prepared acidic colloidal sulfur solution from the reaction of thiosulfate with acid may be suitable for forming film 12 by dipping relatively short times (less than about 4 minutes and, more specifically, less than about 1 minute) at temperatures of up to about 60° C. For example, a copper sulfide(s) film 12, about 35 Å thick, can be formed on exposed top surface of copper conductor 18, by dipping or spraying it for about 30 seconds in a freshly prepared acidic colloidal sulfur solution at about 40° C. In order to reduce colloid flocculation, the bath temperature may be maintained sufficiently low, while still providing reasonable growth rate. In addition, a fresh solution may be used periodically. Suitable temperature and period can be determined routinely by a person skilled in the art without undue experimentation.

EXAMPLE 4

A dilute solution (~0.2% w/w) of ammonium sulfide $(NH_4)_2$ S was tried for copper sulfidation. The solution was prepared by mixing one volume of a concentrated (20-22% w/w) $(NH_4)_2S$ solution with 100 volumes of DI water. The dilute ammonium sulfide solution pH varied from about 10.76 to about 10.66, and its temperature varied from about 20.5° C. to about 22.5° C. Copper blanket samples Cu/Ta/$TaN_x$/$SiO_2$/Si were cut from a silicon wafer, as described in Example 3. The samples were activated as described in Example 3, and were then dipped in the dilute ammonium sulfide solution for times varying from about 0.5 minute to about 8.0 minutes.

The color of the samples sulfidized by the dilute (~0.2% w/w) ammonium sulfide solution varied from dark pink to purple, to violet, to gray, as the dipping time increased. The samples appeared to the naked eye to be dotted and non-uniform. They lost their brightness with the dipping time. Adhesion was tested by the tape-pull test on a sample which was dipped 8.0 minutes in the dilute ammonium sulfide. There was no visible trace or residue on the tape after it was pulled, indicating good adhesion of the copper sulfide(s) film to the copper.

Three samples which were dipped (for 0.5 min, 2.0 min, and 8.0 min) in the dilute ammonium sulfide solution were analyzed by AES depth profile, and inspected by SEM for their surface structure and morphology. The samples revealed pitting (the one dipped for 0.5 min), and severe and rapidly increasing surface roughening with the dipping time. The AES depth profiles revealed large content of oxygen (about 10% to 30% atomic percent (a/o)) in the copper sulfide(s) films. It is believed that the large oxygen content was due to incorporation of oxides (such as CuO) and/or hydroxides (such as $Cu(OH)_2$) from the basic (high pH) dilute ammonium sulfide solution. The AES depth profiles revealed that the oxygen content drops when the sulfur content rises, and vice versa. Surface roughness varied from sparse boulders of about 1,000 Å (for the sample which was dipped for 0.5 min) to dense boulders of about 1,700 Å (for the sample which was dipped for about 2.0 min), to very large boulders, exceeding about 3,500 Å (for the sample which was dipped for 8.0 min). Due to the severe surface roughening, it was not possible to determine the film thickness of these samples from the AES depth profiles. According to a textbook by Edward. J. King, entitled "Qualitative Analysis and Electrolytic Solutions", Harcourt, Brace & World, Inc., 1959, page 185, when basic $(NH_4)_2S$ solutions are used to precipitate CuS (from solutions containing copper ions), some of the copper sulfide redissolves. Such redissolution may explain the severe roughening, and the large oxygen content, of the copper sulfide(s) film prepared by dipping in the dilute basic $(NH_4)_2S$ solution. The redissolution is accompanied by preferential regrowth of some grains (at the expense of other ones), accompanied by the inclusion of copper oxides and/or hydroxides. However, it is believed that an acidic dilute $(NH_4)_2S$ solution may be advantageous for sulfidation of copper surfaces, such as for forming film 12. For example, the acidic dilute $(NH_4)_2S$ solution may comprise a concentration of less than about 0.5% w/w (or about 0.07M) and, more specifically, less than about 0.2% w/w (or about 0.03M) of $(NH_4)_2S$. The pH may be in a range of about 1.0 to about 5.0 and, more specifically, in a range of about 1.5 to about 3.0.

EXAMPLE 5

A sulfidation bath of dilute (~0.01M) acidic thioacetamide $(CH_3CSNH_2)$ solution was prepared by dissolving 0.25 grams of thioacetamide powder in 330 ml of DI water (at 40° C.). The pH of the solution was about 5.5. The solution was then acidified by adding drops of (1:10 v/v) solution of $H_2SO_4$ to attain a pH of about 2.0, and its temperature was raised to about 60° C.

According to the textbook by Edward J. King (see Example 4), pages 180-182, the thioacetamide solution reacts with water (in the presence of acid) by an hydrolysis reaction to generate in situ dissolved $H_2S$. The reaction is believed to proceed according to:

$CH_3CSNH_2 + H_2O \Rightarrow H_2S + CH_3CONH_2$ (acetamide)

The hydrolysis reaction is proportional to the concentration of the acid [$H^+$], proceeding faster with higher concentrations of the acid and the thioacetamide.

In accordance with one or more embodiments of the invention, the generated dissolved $H_2S$ can be used for sulfidation of the copper surface.

It was observed that after the initial acidification of the dilute thioacetamide solution to a pH of about 2.0, the pH continued to drift downward, eventually reaching a value of about 1.50. Since $H_2S$ is a weak acid, it dissociates into $HS^-$ and $H^+$, thereby further increasing the acid concentration (or decreasing the pH), and further catalyzing the $H_2S$ generation.

In accordance with one or more embodiments of the invention, the pH trending can be utilized as a convenient indicator regarding the progression of the hydrolysis reaction. When the pH attains a stable value, it is an indication for the completion of the hydrolysis reaction and the in situ generation of $H_2S$.

Blanket copper samples Cu/Ta/$TaN_x$/$SiO_2$/Si were cut from a silicon wafer, as described in Example 3. They were activated by dipping for about 30 seconds in (1:10 v/v) solution of $H_2SO_4$, rinsed in DI water, and dipped in the acidified dilute thioacetamide solution for varying times (from about 1.0 min to about 3.0 min). The acidified thioacetamide bath temperature was about 60° C., and its pH drifted downward during the experiments from about 1.69 to about 1.49. Following the sulfidation dip in the dilute thioacetamide bath, the samples were rinsed in DI water and dried. All the samples appeared very uniform and shiny. Their color changed from pinkish-purple (for the 1.0 min dip) to dark purple (for the 2.0 min and 3.0 min dips).

Adhesion was tested by the tape-pull test on a sample which was dipped for 2.0 min in the acidified dilute thioacetamide solution. There was no visible trace or residue on the tape after it was pulled, indicating good adhesion of the copper sulfide(s) film to the copper.

The samples obtained by dipping for 1.0 min and for 2.0 min were analyzed by AES depth profiles and by SEM for their surface morphology. The (AES) analyzed sulfidation thickness is plotted as a function of the dipping time (in the acidified dilute thioacetamide solution), at a nominal temperature of 60° C., as Graph B in FIG. 2. Graph B indicates a self-limiting growth process, which was faster than the one shown in Graph A (of the acidic colloidal sulfur at 40° C.). It is believed that the main cause for the faster growth shown in Graph B, was its higher bath temperature (60° C. vs. 40° C.). As seen in Graph B, the copper sulfide film has not yet reached a self-limited thickness at 2.0 min.

The AES analyzed composition of the copper sulfide films indicated that the copper content was about 67% a/o in one sample (the 1.0 min dip), and about 68% a/o in the other sample (the 2.0 min dip). These correspond to a nominal film composition of about $Cu_2S_X$; where $1.0 \geq X \geq 0.95$. SEM inspection of the copper sulfide samples obtained from the acidified dilute thioacetamide solution, revealed slight surface roughening, significantly less than the roughness revealed on the samples obtained by sulfidation in the acidic colloidal sulfur bath and the basic dilute ammonium sulfide bath.

EXAMPLE 6

The acidified dilute thioacetamide sulfidation solution of Example 5 was used to sulfidize exposed copper surfaces of an actual copper interconnect structure, following a chemical mechanical polishing (CMP) step. The patterned copper interconnect was fabricated on a silicon wafer in a conventional way, where trenches and vias were etched into a dielectric layer, followed by successive depositions of a barrier layer ($Ta/TaN_X$), a copper seed layer, and copper electrofilling (ECP) of the openings. Finally, the wafer was planarized by CMP to remove the excess plated copper over the openings and to remove the plated copper, the copper seed layer, and the barrier layer from the field. Pieces (dies) of the wafer were cleaved (or cut) for samples, for the sulfidation experiments.

The acidified dilute thioacetamide bath temperature was about 64° C., and its pH was about 1.50. Prior to sulfidation dipping, the samples were activated as described in Example 5. One sample was dipped for about 0.5 min and the other one was dipped for 1.0 min. Following sulfidation dips, the samples were rinsed in DI water and dried. Both samples appeared shiny and dark pinkish. Both samples were inspected by SEM for surface morphology and to verify the sulfidation process selectivity. The sample dipped for 0.5 min revealed no surface roughening at 70,000× magnification, while the sample which was dipped for 1.0 min revealed a very slight roughening at 70,000×. Both samples revealed (at magnifications up to 70,000×) very clear, crisp, and sharp line delineation between the surrounding dielectric and the sulfidized copper lines. No deposit or other defects or damage were seen on the surrounding dielectric surface. The copper sulfide film thus formed was selectively formed only over the copper lines, but not on the surrounding dielectric.

In accordance with one or more embodiments of the present invention, an acidic solution of $H_2S$, or $HS^-$, or $S^{-2}$ in water is used to sulfidize the top surface of conductor 18, comprising copper, to selectively form film 12 comprising copper sulfide(s), on top of conductor 18 but not over field 14 of dielectric 11. In addition to in situ generation of acidic $H_2S$, or $HS^-$, or $S^{-2}$ in water by hydrolysis of thioacetamide, a dilute acidic solution of $H_2S$, $HS^-$, or $S^{-2}$ (at or below the solubility limit of $H_2S$) may also be obtained by dissolving (for example, and without limitation, by bubbling) $H_2S$ gas in water and adjusting the pH to the desirable value. A desirable pH range for the sulfidation of copper is between about 1.0 to about 5.0 and, more specifically, between about 1.5 to about 3.5. Dilute acidic solutions of $H_2S$, $HS^-$, or $S^{-2}$ (at or below the solubility limit of $H_2S$) may also be obtained by acidifying (for example and without limitation, adding acid to) dilute solutions of $K_2S$, $Na_2S$, or $(NH_4)_2S$.

EXAMPLE 7

Since elemental sulfur is soluble in certain organic solvents, such as $CS_2$, alcohols, and tetrachloroethylene, some organic solvents were tried for sulfidation of copper surface.

In one experiment, isopropyl alcohol (IPA) was added to the acidic colloidal sulfur solution, described in Example 1 above. The IPA cleared the colloidal solution when the IPA volume ratio to that of the colloidal solution volume, was about 1:2. Dipping a copper strip for 2.0 min in the mixed solution, at a temperature of 38° C., and pH of 1.87, caused darkening (pink-brown) of the copper surface, but upon wiping, a brown-black powder residue came off the immersed surface.

In another experiment, small amount of sulfur powder was dissolved in trichloroethylene, and a copper strip was dipped in the solution for 1.0 minute. The immersed surface appeared uniform with a dark blue-gray color. Upon wiping with a paper towel, black powder came off the sample.

Deposition

In accordance with one or more embodiments of the present invention, film 12 may be deposited upon the exposed top surface of conductor interconnect 18. Such a deposition may be carried out by a: (a) dry deposition process such as, for example and without limitation, atomic layer deposition (ALD) or chemical vapor deposition (CVD); (b) physical vapor deposition (PVD) process such as, for example and without limitation, sputtering or evaporation; or (c) wet deposition process such as, for example and without limitation, chemical bath deposition, electrodeposition, or electroless deposition. Except for electroless deposition and electrodeposition, the other deposition processes mentioned above are not selective. For example, using such other deposition processes, copper sulfide will be deposited over the top surface of copper interconnect 18 and the top surface of surrounding dielectric 11 in field 14. As such, the use of non-selective deposition processes may require additional steps for removing copper sulfide deposited over the top surface of dielectric 11 in field 14. In accordance with one or more such embodiments, it is believed that strong adhesion is provided because at least one of such materials is chemically bonded to material at the exposed top surface conductor interconnect 18. In addition, and advantageously in accordance with one or more embodiments of the present invention, because film 12 is chemically bonded to copper underneath it, film 12 adheres well to the top surface of copper interconnect 18. As such, it is believed that film 12 can reduce or eliminate copper surface diffusion, and thereby reduce or eliminate electromigration (EM). It is believed that chemical bonding is enhanced if the temperature of the substrate is elevated during deposition and/or during successive processing steps entailed in fabricating a device.

In accordance with one or more embodiments of the present invention, it is believed that copper atoms at the surface of copper interconnect 18 are chemically bound, for example and without limitation, in a chalcogenide compound comprised of one or more constituents that have a high affinity for copper. In accordance with one or more such embodiments, film 12 may be utilized to passivate the top surface of conductor interconnect 18. In accordance with one or more such embodiments, the thickness of passivation film layer 12 may be in a range from about 10 Å to about 500 Å, and more specifically in a range from about 50 Å to about 200 Å. In addition, film 12 may improve the effective dielectric constant $k_{eff}$ of a multi-level interconnect structure by reducing the required thickness of (or entirely eliminating) the relatively high-k silicon nitride (or other high-k) dielectric capping layer. Although the description above referred mostly to copper metal (Cu) interconnect and copper sulfide ($CuS_X$ and/or $Cu_2S_X$, where $0.7 \leq X \leq 1.3$; and X=1.0 for stoichiometric compounds) films, it should be understood by those skilled in the art that one or more embodiments of the present invention also may be utilized with interconnects comprising any highly conductive metal or alloy, such as, for example and without limitation, silver metal (Ag) or alloys which comprise one or more of the metals Cu and Ag. Similarly, it should be understood that one or more embodiments of the present invention also include films which comprise silver sulfide ($AgS_X$ and/or $Ag_2S_X$, where $0.7 \leq X \leq 1.3$; and X=1.0 for stoichiometric compounds) and/or mixtures of other sulfide compounds comprising one or more atoms selected from the group consisting of Cu and Ag. In addition, it should be understood that one or more embodiments of the present invention also include films which comprise copper selenides and/or tellurides, silver selenides and/or tellurides, and mixtures thereof (consisting of one or more of copper and/or silver sulfides, selenides, and tellurides).

Copper sulfide passivation film 12 described above with respect to intermixing growth and deposition processes is further advantageous because it also adheres well to dielectric layers such as, for example and without limitation, dielectric layers that overlay in structures used to fabricate devices such as semiconductor devices, thereby improving the mechanical strength and the structural integrity of multi-level metallization devices. Furthermore, since copper sulfide film 12 is not a dielectric material (actually it is conductive, having a resistivity ρ value in a range of about $10^{-4}$ to about $10^{-2}$ ohm-cm), it does not increase the effective dielectric constant ($k_{eff}$) of structures 100 or 110. In accordance with one or more embodiments, the thickness of passivation film (or layer) 12 may be in a range from about 10 Å to about 500 Å and, more specifically, in a range from about 50 Å to about 200 Å.

FIG. 1(b) shows a pictorial representation of a transverse (along the width) cross-section (not to scale for ease of understanding) of structure 110 used to fabricate, for example and without limitation, a semiconductor device that includes structure 100 shown in FIG. 1(a) and a dielectric layer 19 that overlays structure 100. In accordance with one or more embodiments of the present invention, dielectric layer 19 may be utilized as an etch-stop layer (ESL) during etching of successive vias and/or trenches for a higher metallization level. Dielectric layer 19 may also serve as an additional capping diffusion barrier against copper outdiffusion. Dielectric layer 19 may comprise, for example and without limitation, silicon nitride, silicon carbide, silicon carbide nitride, silicon nitride oxide, $SiC_xH_y$, or $SiC_xO_yH_z$. Dielectric layer 19 may be deposited using any one of a number of deposition processes that are well known to those skilled in the art, for example and without limitation, by a chemical vapor deposition (CVD) or by a plasma enhanced CVD (PECVD), at a temperature range of about 400-500° C., or less. As described above, passivation film 12 adheres well to dielectric layers, and as such, film 12 adheres well to dielectric layer 19. As such, passivation film 12 may significantly improve the strength and structural integrity of multi-level metallization devices.

It is believed that conventional interfaces between copper lines and the capping dielectric barrier (such as silicon nitride or silicon carbide) effectively generate micro-crack precursors which, under thermal and/or mechanical stress, may propagate into the surrounding (mechanically weak) dielectric, thus adversely affecting the structural integrity. It is further believed that, many of the current mechanical strength and structural integration problems associated with low-k dielectrics in advanced interconnect structures (such as packaging problems), are related to such interfacial micro-cracks precursors. Thus, interposing a copper chalcogenide film, such as a copper sulfide film 12, between the copper lines 18 and the capping dielectric layer 19, with strong adhesion to both, can effectively mitigate or eliminate the deleterious interfacial micro-crack precursors, thereby improving the mechanical strength and structural integrity of the device.

Further Processing

In order to minimize via resistance, it may be desirable or advantageous to remove passivation film 12 from under the bottom of a successive via (not shown), prior to copper or silver filling, by a short etching step. In accordance with one or more embodiments of the present invention, passivation film 12 can be selectively removed from under the bottom of successive vias (not shown) by an etching step such as, for example and without limitation, using a directional dry etching technique such as sputter etching, ion milling, or reactive ion etching (RIE) through the successive vias. Film 12 may also be selectively removed from under the bottom of the vias by wet chemical etching through the successive vias, utilizing, for example and without limitation, $HNO_3$ and/or $H_2SO_4$. Where dielectric layer 19 is formed over film 12, the etching of film 12 can be integrated into the removal (etching) step of layer 19 from the successive vias' bottom, usually by a RIE technique. The chemistry used for the etching of layer 19 may also be utilized for the RIE etching of film 12, or film 12 may be removed by a separate subsequent step, utilizing ion milling, or by a different PIE gas chemistry, suitable for the removal of film 12.

Structures comprising successive vias disposed over film 12 and/or dielectric barrier 19, with film 12 and/or dielectric barrier 19 selectively removed from the successive vias' bottom, ensure minimal vias resistance by direct metallic contact to the preceding (i.e., lower) copper metallization level 18.

Although the description of the embodiments and examples above has concentrated on metallic interconnect structures used to fabricate a device such as a semiconductor integrated circuits, these embodiments can also be used in the fabrication of other devices, such as (coils in) thin film heads, Micromachined Microelectromechanical Systems (MEMS) devices, or interconnects in high density integrated circuit packages.

Those skilled in the art will recognize that the foregoing description has been presented for the sake of illustration and description only. As such, it is not intended to be exhaustive or to limit the invention to the precise form disclosed.

What I claim is:

1. An interconnect structure comprising:
   a metallic conductor embedded in at least one surrounding dielectric layer, said metallic conductor comprising copper;
   a passivation capping film comprising copper sulfide disposed directly over the metallic conductor but not over the at least one surrounding dielectric layer; and a dielectric capping barrier layer disposed directly over the passivation capping film.

2. The interconnect structure of claim 1 wherein the dielectric capping barrier layer comprises a material selected from the group consisting of silicon nitride, silicon carbide, silicon carbide nitride, silicon nitride oxide, $SiC_xH_y$, and $SiC_xO_yH_z$.

3. The interconnect structure of claim 1 further comprising at least one metal-filled successive via disposed over said metallic conductor, wherein a bottom of the at least one metal-filled successive via is in direct metallic contact with the metallic conductor.

4. An interconnect structure comprising:
a metallic conductor embedded in at least one surrounding dielectric layer, said metallic conductor comprising copper or a copper alloy;
a copper sulfide film disposed directly over the metallic conductor but not over the at least one surrounding dielectric layer, said copper sulfide film has a thickness larger than 50 Å over the metallic conductor; and
a dielectric capping barrier layer disposed over the copper sulfide film and the at least one surrounding dielectric layer.

5. The interconnect structure of claim 4 further comprising a metal-filled successive via disposed over said metallic conductor, wherein a bottom of the metal-filled successive via is in direct metallic contact with the metallic conductor.

6. The interconnect structure of claim 1 wherein the metallic conductor comprises a copper alloy.

7. The interconnect structure of claim 3 wherein the metallic conductor comprises a copper alloy.

8. The interconnect structure of claim 4 wherein the dielectric capping barrier layer comprises a material selected from the group consisting of silicon nitride, silicon carbide, silicon carbide nitride, silicon nitride oxide, $SiC_xH_y$, and $SiC_xO_yH_z$.

9. The interconnect structure of claim 5 wherein the dielectric capping barrier layer comprises a material selected from the group consisting of silicon nitride, silicon carbide, silicon carbide nitride, silicon nitride oxide, $SiC_xH_y$, and $SiC_xO_yH_z$.

10. The interconnect structure of claim 1 wherein the dielectric capping barrier layer comprises silicon nitride.

11. The interconnect structure of claim 3 wherein the dielectric capping barrier layer comprises a material selected from the group consisting of silicon nitride, silicon carbide, silicon carbide nitride, silicon nitride oxide, $SiC_xH_y$, and $SiC_xO_yH_z$.

12. The interconnect structure of claim 1 wherein the passivation capping film has thickness in a range from about 10 Å to about 500 Å.

13. The interconnect structure of claim 12 wherein the passivation capping film has thickness in a range from about 50 Å to about 200 Å.

14. The interconnect structure of claim 3 wherein the passivation capping film has thickness in a range from about 10 Å to about 500 Å.

15. The interconnect structure of claim 14 wherein the passivation capping film has thickness in a range from about 50 Å to about 200 Å.

16. The interconnect structure of claim 3 wherein the dielectric capping barrier layer comprises silicon nitride.

17. The interconnect structure of claim 1 wherein the dielectric capping barrier layer comprises silicon carbide.

18. The interconnect structure of claim 3 wherein the dielectric capping barrier layer comprises silicon carbide.

19. The interconnect structure of claim 1 wherein the dielectric capping barrier layer comprises silicon carbide nitride.

20. The interconnect structure of claim 3 wherein the dielectric capping barrier layer comprises silicon carbide nitride.

* * * * *